(12) United States Patent
Lim et al.

(10) Patent No.: US 10,032,830 B2
(45) Date of Patent: Jul. 24, 2018

(54) ORGANIC LIGHT EMITTING DISPLAY DEVICE

(71) Applicant: LG Display Co., Ltd., Seoul (KR)

(72) Inventors: TaeSeok Lim, Seoul (KR); Taeshick Kim, Gyeonggi-do (KR); Seung Kim, Seoul (KR); Jaeseung Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/160,256

(22) Filed: May 20, 2016

(65) Prior Publication Data
US 2017/0117331 A1    Apr. 27, 2017

(30) Foreign Application Priority Data
Oct. 23, 2015  (KR) .................. 10-2015-0147990

(51) Int. Cl.
| H01L 27/32 | (2006.01) |
| H01L 51/52 | (2006.01) |
| H01L 51/50 | (2006.01) |

(52) U.S. Cl.
CPC ...... *H01L 27/3211* (2013.01); *H01L 51/5036* (2013.01); *H01L 51/5044* (2013.01); *H01L 51/5209* (2013.01); *H01L 51/5225* (2013.01); *H01L 27/322* (2013.01); *H01L 27/3209* (2013.01); *H01L 27/3244* (2013.01)

(58) Field of Classification Search
CPC .......... H01L 27/3211; H01L 51/5225; H01L 51/5036; H01L 27/3262; H01L 51/5209
USPC .......................................................... 257/40
See application file for complete search history.

(56) References Cited

U.S. PATENT DOCUMENTS

| 2006/0261731 | A1  | 11/2006 | Aziz et al. |
| 2011/0073844 | A1* | 3/2011  | Pieh ............ H01L 51/5036 257/40 |
| 2014/0167016 | A1  | 6/2014  | Yoo et al. |
| 2015/0188074 | A1  | 7/2015  | Heo et al. |
| 2016/0005990 | A1* | 1/2016  | Lee ............ H01L 51/5036 257/40 |

(Continued)

FOREIGN PATENT DOCUMENTS

| CN | 1866536   A | 11/2006 |
| CN | 103872253 A | 6/2014 |

(Continued)

OTHER PUBLICATIONS

First Notification of Office Action dated Oct. 30, 2017 from the State Intellectual Property Office of China in related hinese application No. 201610354032.0.

*Primary Examiner* — Fernando L Toledo
*Assistant Examiner* — Adam S Bowen
(74) *Attorney, Agent, or Firm* — Morgan, Lewis & Bockius LLP (57) ABSTRACT

An organic light emitting display device reduces a grayscale-based color difference of the organic light emitting display device. The organic light emitting display device includes opposite first and second electrodes on a substrate and a plurality of emission parts between the first and second electrodes. At least one among the plurality of emission parts includes a first emission layer and a second emission layer having different wavelength ranges. A dopant content in the first emission layer is lower than a dopant content in the second emission layer.

21 Claims, 4 Drawing Sheets

(56) References Cited

U.S. PATENT DOCUMENTS

2017/0179405 A1    6/2017  Wu et al.

FOREIGN PATENT DOCUMENTS

| CN | 104752625 A | 7/2015 |
| CN | 104795507 A | 7/2015 |
| KR | 20110035048 A | 4/2011 |

* cited by examiner

ORGANIC LIGHT EMITTING DISPLAY DEVICE

CROSS-REFERENCE TO RELATED APPLICATIONS

This application claims the benefit of the Korean Patent Application No. 10-2015-0147990 filed on Oct. 23, 2015, which is hereby incorporated by reference as if fully set forth herein.

BACKGROUND

Field

The disclosure relates to an organic light emitting display device, and more particularly, to an organic light emitting display device for reducing a grayscale-based color difference of the organic light emitting display device.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices (OLED), etc.

Particularly, the organic light emitting display devices are self-emitting devices. In comparison with other display devices, the organic light emitting display devices have a fast response time, high emission efficiency, high luminance, and a wide viewing angle and thus are attracting much attention.

The organic light emitting display devices each include an organic emission layer which is formed between two electrodes. An electron and a hole are injected from the two electrodes into the organic emission layer, and an exciton is generated by combining the electron with the hole. The organic light emitting display devices are devices based on the principle that light is emitted when the generated exciton is dropped from an excited state to a ground state.

PATENT REFERENCE (Patent reference 1) 1. White organic light emitting diode (Korean Patent Application No. 10-2009-0092596; KR Publication No. 10-2011-0035048-A; and US Publication No. 2011/0073844-A)

SUMMARY

Accordingly, the disclosure is directed to an organic light emitting display device that substantially obviates one or more problems due to limitations and disadvantages of the related art.

An object of the prevent disclosure is to provide an organic light emitting display device that reduces a grayscale-based color difference of the organic light emitting display device Another object of the prevent disclosure is to provide an organic light emitting display device in which one emission part includes emission layers having different wavelength ranges, and a dopant content included in the emission layers is optimized.

Additional features and advantages of the disclosure will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the disclosure, as embodied and broadly described herein, an organic light emitting display device comprises first and second electrodes facing each other on a substrate and a plurality of emission parts between the first and second electrodes, at least one among the plurality of emission parts including a first emission layer and a second emission layer having different wavelength ranges, wherein a dopant content in the first emission layer is lower than a dopant content in the second emission layer.

The first emission layer may include a red emission layer, and the second emission layer may include one among a yellow-green emission layer and a green emission layer.

A peak wavelength of the first emission layer may be 600 nm to 650 nm, and a peak wavelength of the second emission layer may be 510 nm to 590 nm.

The dopant content in the first emission layer may be 0.1% to 10.0%.

The dopant content in the first emission layer may be 0.1% or more and less than 3.0%.

The first emission layer may be disposed closer to the first electrode than the second emission layer.

The first emission layer may be disposed closer to the second electrode than the second emission layer.

A color difference may be 0.020 at 1 mA/cm$^2$ in comparison with 40 mA/cm$^2$ which is a current density of the organic light emitting display device.

In another aspect, an organic light emitting display device comprises an anode and a cathode facing each other and an emission part disposed between the anode and the cathode, the emission part including a plurality of emission layers having different wavelength ranges, wherein the plurality of emission layers having the different wavelength ranges each includes at least one host and at least one dopant, a dopant content in an emission layer corresponding to a long wavelength among the plurality of emission layers having the different wavelength ranges is lower than a dopant content in another emission layer corresponding to a wavelength shorter than the long wavelength.

The emission layer corresponding to the long wavelength may include a red emission layer, and the other emission layer corresponding to the wavelength shorter than the long wavelength may include one among a yellow-green emission layer and a green emission layer.

A peak wavelength of the emission layer corresponding to the long wavelength may be 600 nm to 650 nm, and a peak wavelength of the other emission layer corresponding to the wavelength shorter than the long wavelength may be 510 nm to 590 nm.

The dopant content in the emission layer corresponding to the long wavelength may be 0.1% to 10.0%.

The dopant content in the emission layer corresponding to the long wavelength may be 0.1% or more and less than 3.0%.

The emission layer corresponding to the long wavelength may be disposed closer to the anode than the cathode.

The first emission layer may be disposed closer to the cathode than the anode.

A color difference may be 0.020 at 1 mA/cm² in comparison with 40 mA/cm² which is a current density of the organic light emitting display device.

In another aspect, an organic light emitting display device comprises emission part includes a red emission layer and a yellow-green emission layer or a green emission layer, characterized in that a dopant content in the red emission layer is adjusted to emit red light and green light in a current density of 1 mA/cm² or less.

The dopant content in the red emission layer may be 0.1% to 10.0%.

The dopant content in the red emission layer may be 0.1% or more and less than 3.0%.

A color difference may be 0.020 at 1 mA/cm² in comparison with 40 mA/cm² which is a current density of the organic light emitting display device.

It is to be understood that both the foregoing general description and the following detailed description of the disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Reference will now be made in detail to the exemplary embodiments of the disclosure, examples of which are illustrated in the accompanying drawings. Wherever possible, the same reference numbers will be used throughout the drawings to refer to the same or like parts.

Advantages and features of the disclosure, and implementation methods thereof will be clarified through following embodiments described with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Further, the disclosure is only defined by scopes of claims.

A shape, a size, a ratio, an angle, and a number disclosed in the drawings for describing embodiments of the disclosure are merely an example, and thus, the disclosure is not limited to the illustrated details. Like reference numerals refer to like elements throughout. In the following description, when the detailed description of the relevant known function or configuration is determined to unnecessarily obscure the important point of the disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent', 'next~', and 'before', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

Features of various embodiments of the disclosure may be partially or overall coupled to or combined with each other, and may be variously inter-operated with each other and driven technically as those skilled in the art can sufficiently understand. The embodiments of the disclosure may be carried out independently from each other, or may be carried out together in co-dependent relationship.

Recently, organic light emitting display devices for emitting white light have been developed. The white organic light emitting display devices are widely applied to various fields such as backlights, illumination, etc. and are being recognized as the most important display devices.

Examples of a method where an organic light emitting display device realizes white may include a single layer emission method, a multilayer emission method, a color conversion method, an element stacked method, etc. The multilayer emission method among the methods is being used at present. In the multilayer emission method, white is realized by a combination of colors of lights respectively emitted from a plurality of layers.

The white organic light emitting device may have a structure which includes two emission layers having a complementary color relationship. However, in the structure, a difference between a wavelength range of an electroluminescence (EL) peak of each emission layer and a transmissive area of a color filter occurs when white light passes through the color filter. For this reason, a color range where colors are realized is narrowed, and consequently, it is difficult to realize a desired color reproduction rate.

For example, in an organic light emitting device which includes a blue emission layer and a yellow emission layer and emits white light, an EL peak is generated in a blue wavelength range and a yellow wavelength range, and thus, white light is emitted. When the white light passes through red, green, and blue color filters, a transmittance of the blue wavelength range is lowered compared to a red or green wavelength range, thus emission efficiency and a color reproduction rate are lowered. Moreover, the blue emission layer is formed of a fluorescence emitting material, and the yellow emission layer is formed of a phosphorescence emitting material. In this case, an emission efficiency of a yellow phosphorescence emission layer is relatively higher than that of a blue fluorescence emission layer, thus emission efficiency and a color reproduction rate are reduced due to an efficiency difference between the yellow phosphorescence emission layer and the blue fluorescence emission layer. Moreover, since the yellow emission layer realizes green and red, red efficiency is reduced. Therefore, red efficiency and a color reproduction rate are reduced. Furthermore, in an organic light emitting device with improved color reproduction rate, a grayscale-based color difference increases.

The inventors have recognized the above-described problems and have done various experiments for reducing a grayscale-based color difference which occurs in an organic light emitting display device. Through the various experiments, the inventors have invented an organic light emitting display device for reducing a grayscale-based color difference of an organic light emitting display device.

Hereinafter, embodiments of the disclosure will be described in detail with reference to the accompanying drawings.

Figure 1:
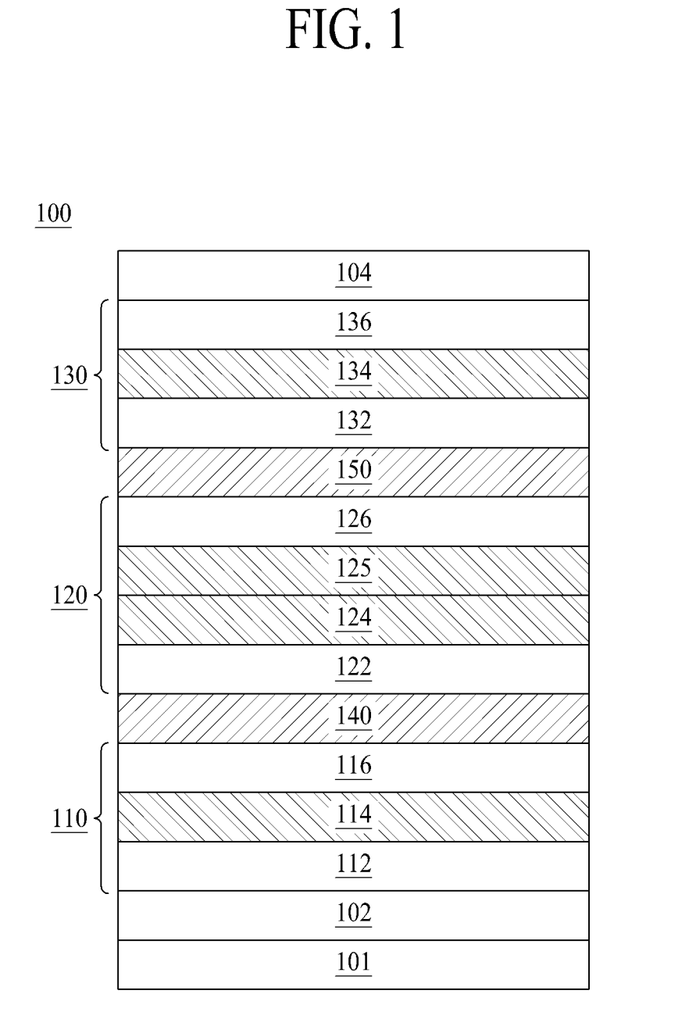
FIG. 1 is a schematic cross-sectional view illustrating an organic light emitting device according to an embodiment of the disclosure.

FIG. 1 is a schematic cross-sectional view illustrating an organic light emitting device 100 according to an embodiment of the disclosure.

The organic light emitting device 100 illustrated in FIG. 1 may include first and second electrodes 102 and 104 on a substrate 101 and first to third emission parts 110 to 130 between the first and second electrodes 102 and 104.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 102 is an anode that supplies a hole, and may be formed of transparent conductive oxide (TCO) which is a transparent conductive material such as indium tin oxide (ITO), indium zinc oxide (IZO), or the like. However, the embodiment is not limited thereto. Alternatively, the first electrode 102 may be formed of gold (Au), silver (Ag), aluminum (Al), molybdenum (Mo), magnesium (Mg), lithium (Li), calcium (Ca), lithium fluoride (LiF), Ag—Mg, Mg—LiF, ITO, IZO, and/or the like, may be formed of an alloy thereof, or may be formed of a single layer or a multilayer. However, the embodiment is not limited thereto.

The second electrode 104 is a cathode that supplies an electron, and may be formed of Au, Ag, Al, Mo, Mg, Li, Ca, LiF, ITO, IZO, Ag—Mg, Mg—LiF, and/or the like, or may be formed of an alloy thereof. The second electrode 104 may be formed of a single layer or a multilayer. However, the embodiment is not limited thereto.

The first electrode 102 may be referred to as an anode and the second electrode 104 may be referred to as a cathode. Alternatively, the first electrode 102 may be formed as a transmissive electrode, and the second electrode 104 may be formed as a semitransmissive electrode. Alternatively, the first electrode 102 may be formed as a reflective electrode, and the second electrode 104 may be formed as a semitransmissive electrode. Alternatively, the first electrode 102 may be formed as a semitransmissive electrode, and the second electrode 104 may be formed as a reflective electrode. Alternatively, at least one among the first and second electrodes 102 and 104 may be formed as a semitransmissive electrode.

Herein, a bottom emission display device where the first electrode 102 is a semitransmissive electrode and the second electrode 104 is a reflective electrode will be described.

The first emission part 110 may include a first hole transport layer (HTL) 112, a first emission layer (EML) 114, and a first electron transport layer (ETL) 116 which are disposed on the first electrode 102.

A hole injection layer (HIL) may be further formed on the first electrode 102. The HIL enables a hole, supplied from the first electrode 102, to be smoothly injected into the first HTL 112. The first HTL 112 may supply a hole, supplied from the HIL, to the first EML 114. The first ETL 116 may supply an electron, supplied from the second electrode 104, to the first EML 114. Therefore, a hole supplied through the first HTL 112 and an electron supplied through the first ETL 116 may be recombined in the first EML 114 to generate an exciton. A zone where the exciton is generated may be referred to as a recombination zone or an emission zone (an emission area).

The HIL may be formed of 4,4',4"-tris(3-methylphenylamino)triphenylamine (MTDATA), copper phthalocyanine (CuPc), poly(3,4-ethylenedioxythiophene, polystyrene sulfonate (PEDOT/PSS), and/or the like, but is not limited thereto.

The first HTL 112 may be formed of two or more layers or two or more materials. The first HTL 112 may be formed of one or more of N,N'-bis(naphthalen-1-yl)-N,N-bis(phenyl)-2,2'-dimethylbenzidine (NPD), N,N'-bis-(3-methylphenyl)-N,N'-bis-(phenyl)-benzidine (TPD), 2,2',7,7-tetrakis(N,N-diphenylamino)-9,9-spirofluorene (s-TAD), and 4,4',4"-Tris(N-3-methylphenyl-N-phenyl-amino)-triphenylamine (MTDATA), but is not limited thereto.

The first ETL 116 may be formed of two or more layers or two or more materials. The first ETL 116 may be formed of one or more of tris(8-hydroxy-quinolinato)aluminum (Alq$_3$), 2-(4-biphenyl)-5-(4-tert-butylphenyl)-1,3,4-oxadiazole (PBD), 3-(4-biphenyl)4-phenyl-5-tert-butylphenyl-1,2,4-triazole (TAZ), Spiro-PBD, bis(2-methyl-8Oquiolinolate)-4-(phenylphenolato)aluminum (BAlq), 8-hydroxyquinolinolato-lithium (Liq), 5,5'-bis(dimethylboryl)-2,2':5',2"-terthiophene (BMB-3T), perfluoro-2-naphthyl-substituted (PF-6P), 2,2',2"-(1,3,5-benzinetriyl)-tris(1-phenyl-1-H-benzimidazole (TPBi), and cyclooctatetracene (COT), but is not limited thereto.

An electron injection layer (EIL) may be further formed on the first ETL 116. The EIL enables an electron, supplied from the second electrode 104, to be smoothly injected into the first ETL 116.

A hole blocking layer (HBL) may be further formed on the first EML 114. The HBL prevents a hole, injected into the first EML 114, from being transferred to the first ETL 116 and thus enhances a combination of an electron and a hole in the first EML 114, thereby enhancing an emission efficiency of the first EML 114. The first ETL 116 and the HBL may be provided as one layer.

An electron blocking layer (EBL) may be further formed under the first EML 114. The EBL prevents an electron, injected into the first EML 114, from being transferred to the first HTL 112 and thus enhances a combination of an electron and a hole in the first EML 114, thereby enhancing an emission efficiency of the first EML 114. The first HTL 112 and the EBL may be provided as one layer.

The first EML 114 may include one among a blue EML, a deep blue EML, and a sky blue EML. A peak wavelength (λmax) of light emitted from the first emission part 110 may be within a range of 440 nm to 480 nm.

A host of the first EML 114 may be formed of a single material or may be a mixed host having mixed materials. The mixed host may include a hole-type host and an electron-type host. For example, the host constituting the first EML 114 may be one or more materials among 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), 2,2',7,7'-tetrakis(2,2-diphenylvinyl)-spiro-9,9'-bifluorene(spiro-DPVBi), spirobifluorene (spiro-6P), distyryl-benzene (DSB), distyryl arylene (DSA), a polyfluorene (PFO)-based polymer, and a polyphenylenevinylene (PPV)-based material or may be formed by mixing two or more materials thereof, but is not limited thereto.

Moreover, the dopant constituting the first EML 114 may be formed of a pyrene-based material. In more detail, the dopant may be formed of a pyrene-based compound substituted with an arylamine-based compound, but is not limited thereto.

The first HTL 112, the first EML 114, the first ETL 116, the HIL, the EIL, the HBL, and the EBL may each be formed of an organic layer. Therefore, at least one emission part may include at least one organic layer.

The second emission part 120 may include a second HTL 122, a second EML 124, a third EML 125, and a second ETL 126.

The second HTL 122 may be formed of the same material as that of the first HTL 112, but is not limited thereto. The second HTL 122 may be formed of two or more layers or two or more materials. Also, an HIL may be further formed under the second HTL 122.

The second ETL 126 may be formed of the same material as that of the first ETL 116, but is not limited thereto. The second ETL 126 may be formed of two or more layers or two or more materials. Also, an EIL may be further formed on the second ETL 126.

An EBL may be further formed under the second EML 124. Also, the second HTL 122 and the EBL may be provided as one layer.

An HBL may be further formed on the third EML 125. Also, the second ETL 126 and the HBL may be provided as one layer.

The second EML 124 and the third EML 125 may be formed as EMLs having different wavelength ranges. That is, the second EML 124 of the second emission part 120 may be formed as a red EML. Also, the third EML 125 of the second emission part 120 may be formed as one among a yellow-green EML and a green EML. When a red EML which is the second EML 124 is further formed in the second emission part 120, the red efficiency of an organic light emitting display device is enhanced. Also, a peak wavelength (λmax) of light emitted from the second EML 124 may be within a range of 600 nm to 650 nm, and a peak wavelength (λmax) of light emitted from the third EML 125 may be within a range of 510 nm to 590 nm. Therefore, a peak wavelength (λmax) of light emitted from the second emission part 120 may be within a range of 510 nm to 650 nm.

The red EML corresponding to the second EML 124 may be disposed under the yellow-green EML or the green EML corresponding to the third EML 125. Therefore, the red EML may be disposed closer to the first electrode 102 than the yellow-green EML or the green EML. Alternatively, the red EML corresponding to the second EML 124 may be disposed on the yellow-green EML or the green EML corresponding to the third EML 125. Therefore, the red EML may be disposed closer to the second electrode 104 than the yellow-green EML or the green EML.

Also, the red EML may be an EML corresponding to a long wavelength range. The yellow-green EML or the green EML may be an EML corresponding to a wavelength shorter than that of the red EML. Here, a long wavelength may correspond to a wavelength range where red is realized at 560 nm to 780 nm corresponding to a visible light range, and a wavelength shorter than the long wavelength may correspond to a wavelength range where yellow-green or green is realized at 480 nm to 590 nm corresponding to a visible light range.

A host of the second EML 124 may be formed of a single material or may be a mixed host having mixed materials. The mixed host may include a hole-type host and an electron-type host. For example, the host constituting the second EML 124 may include one or more host materials, and examples of the one or more host materials may include 4,4'-bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, etc. A dopant constituting the second EML 124 may be a phosphorescent dopant, and examples of the phosphorescent dopant may include bis(2-benzo[b]thiophen-2-yl-pyridine)(acetylacetonate(iridium(III)) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), etc. Alternatively, the dopant constituting the second EML 124 may be a fluorescent dopant, and examples of the fluorescent dopant may include perylene and the like. The host material or the dopant material constituting the second EML 124 does not limit details of the disclosure.

A host of the third EML 125 may be formed of a single material or may be a mixed host having mixed materials. The mixed host may include a hole-type host and an electron-type host. For example, the host constituting the third EML 125 may include one among 4,4',4"-tris(carbazol-9-yl)triphenylamine (TCTA), 4,4'-bis(carbazol-9-yl)biphenyl (CBP), bis(2-methyl-8-quinolinolate)-(4-phenylphenolato)aluminum (BAlq), polyphenylenevinylene (PPV), etc., but is not limited thereto. The dopant constituting the third EML 125 may include an iridium-based compound. The host material or the dopant material constituting the third EML 125 does not limit details of the disclosure.

The second HTL 122, the second EML 124, the third EML 125, the second ETL 126, the HIL, the EIL, the HBL, and the EBL may each be formed of an organic layer. Therefore, at least one emission part may include at least one organic layer.

A first charge generation layer (CGL) 140 may be further formed between the first emission part 110 and the second emission part 120. The first CGL 140 may adjust a charge balance between the first emission part 110 and the second emission part 120. The first CGL 140 may include a first N-type CGL and a first P-type CGL.

The first N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. The first P-type CGL may be formed as an organic layer including a P-type dopant, but is not limited thereto. Also, the first CGL 140 may be formed of a single layer. Also, the first N-type CGL and the first P-type CGL which are included in the first CGL 140 may each be formed as an organic layer.

The third emission part 130 may include a third HTL 132, a fourth EML 134, and a third ETL 136 which are disposed on the second emission part 120.

An HIL may be further formed under the third HTL 132.

The third HTL 132 may be formed of N,N'-bis(3-methylphenyl)-N,N'-bis(phenyl)-benzidine (TPD), N,N'-bis (naphthalene-1-yl)-N,N'-bis(phenyl)-benzidine (NPB), and/or the like, but is not limited thereto. Also, the third HTL 132 may be formed of two or more layers or two or more materials.

An EIL may be further formed on the third ETL 136.

The third ETL 136 may be formed of the same material as that of the first ETL 116, but is not limited thereto. The third ETL 136 may be formed of two or more layers or two or more materials.

An EBL may be further formed under the fourth EML 134. Also, the third HTL 132 and the EBL may be provided as one layer.

An HBL may be further formed on the fourth EML 134. Also, the third ETL 136 and the HBL may be provided as one layer.

The fourth EML 134 of the third emission part 130 may include one among a blue EML, a deep blue EML, and a sky blue EML. A peak wavelength ($\lambda$max) of light emitted from the third emission part 130 may be within a range of 450 nm to 480 nm.

A host of the fourth EML 134 may be formed of a single material or may be a mixed host having mixed materials. The mixed host may a hole-type host and an electron-type host. For example, the host constituting the fourth EML 134 may be one or more materials among 4,4'bis(carbozol-9-yl) biphenyl (CBP), 1,3-bis(carbazol-9-yl)benzene (MCP), N,N'-bis(naphthalene-1-yl)-N,N'-bis(phenyl)-2,2'-dimethylbenzidine (NPD), 2,2',7,7'-tetrakis(2,2-diphenylvinyl)-spiro-9,9'-bifluorene (spiro-DPVBi), spirobifluorene (spiro-6P), distyryl-benzene (DSB), distyryl arylene (DSA), a PFO-based polymer, and a PPV-based material or may be formed by mixing two or more materials thereof, but is not limited thereto.

Moreover, the dopant constituting the fourth EML 134 may be formed of a pyrene-based material. In more detail, the dopant may be formed of a pyrene-based compound substituted with an arylamine-based compound, but is not limited thereto.

The third HTL 132, the fourth EML 134, the second ETL 136, the HIL, the EIL, the HBL, and the EBL may each be formed of an organic layer. Therefore, at least one emission part may include at least one organic layer.

A second CGL 150 may be further formed between the second emission part 120 and the third emission part 130. The second CGL 150 may adjust a charge balance between the second emission part 120 and the third emission part 130. The second CGL 150 may include a second N-type CGL and a second P-type CGL.

The second N-type CGL may inject an electron into the second emission part 120, and the second P-type CGL may inject a hole into the third emission part 130. The second N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) is doped, but is not limited thereto. The second P-type CGL may be formed as an organic layer including a P-type dopant, but is not limited thereto. The first N-type CGL and first P-type CGL of the first CGL 140 may be formed of the same material as that of the second N-type CGL and second P-type CGL of the second CGL 150, but are not limited thereto. Also, the second CGL 150 may be formed of a single layer.

The first HTL 112, the first EML 114, the first ETL 116, the second HTL 122, the second EML 124, the third EML 125, the second ETL 126, the third HTL 132, the fourth EML 134, the third ETL 136, the first CGL 140, the second CGL 150, the HIL, the EIL, the HBL, and the EBL may each be formed of an organic layer. Therefore, at least one emission part may include at least one organic layer. Also, at least one among the first to third emission parts 110 to 130 may include EMLs having different wavelength ranges. That is, the at least one emission part may be configured with an emission part that includes a red EML and a yellow-green EML or a green EML. Alternatively, the at least one emission part may be configured with an emission part that includes an EML corresponding to a long wavelength and an EML corresponding to a wavelength shorter than the long wavelength.

In FIG. 1, the organic light emitting device has been described as including three emission parts, but is not limited thereto. In other embodiments, the organic light emitting device may be configured with four or more emission parts.

As described above with reference to FIG. 1, the second emission part 120 may be configured with the yellow-green EML or the green EML and the red EML, thereby solving a problem where color efficiency is reduced in a case where the second emission part 120 is configured with the yellow-green EML or the green EML. However, the inventors have recognized that since the red EML emits light more than light emitted from the yellow-green EML or the green EML, the light emitted from the yellow-green EML or the green EML is reduced, or the light emitted from the red EML is shown. That is, when the red EML is further provided, the inventors have recognized that red efficiency is enhanced, but yellow-green efficiency or green efficiency is reduced. In this context, the inventors have recognized that emission of light from the yellow-green EML or the green EML is affected by a material of a dopant included in the red EML, and consequently, the inventors have attempted to change the material of the dopant. However, since it takes much time to change the material of the dopant, the inventors have done an experiment on whether the yellow-green EML or the green EML emits the light when a dopant content included in the red EML is changed. Thus, a result of the experiment on whether the yellow-green EML or the green EML emits the light based on the dopant content included in the red EML will be described with reference to FIGS. 2 to 4.

Figure 2:
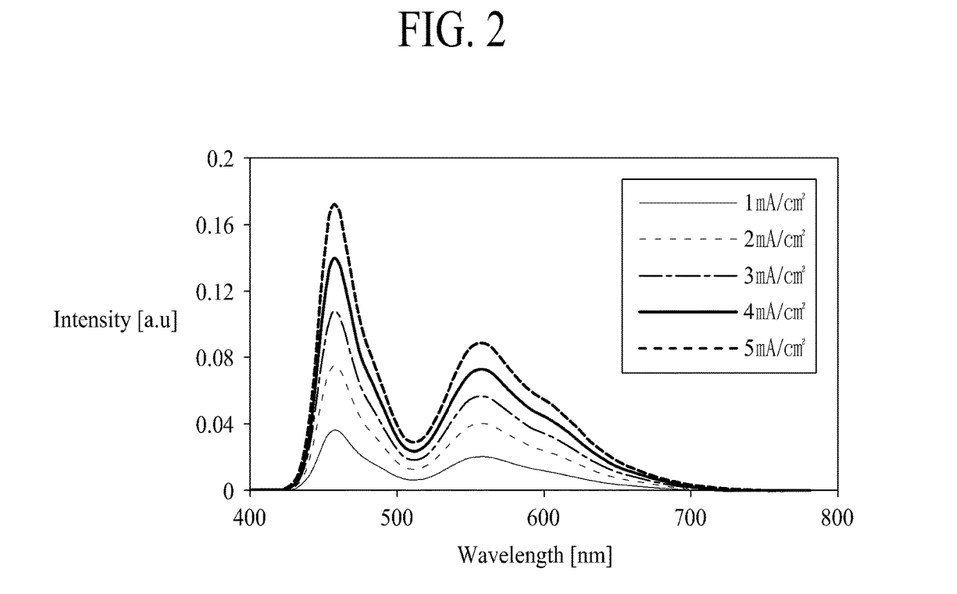
FIG. 2 is a diagram showing an EL spectrum with respect to a current density, according to an embodiment 1 of the disclosure.
Figure 3:
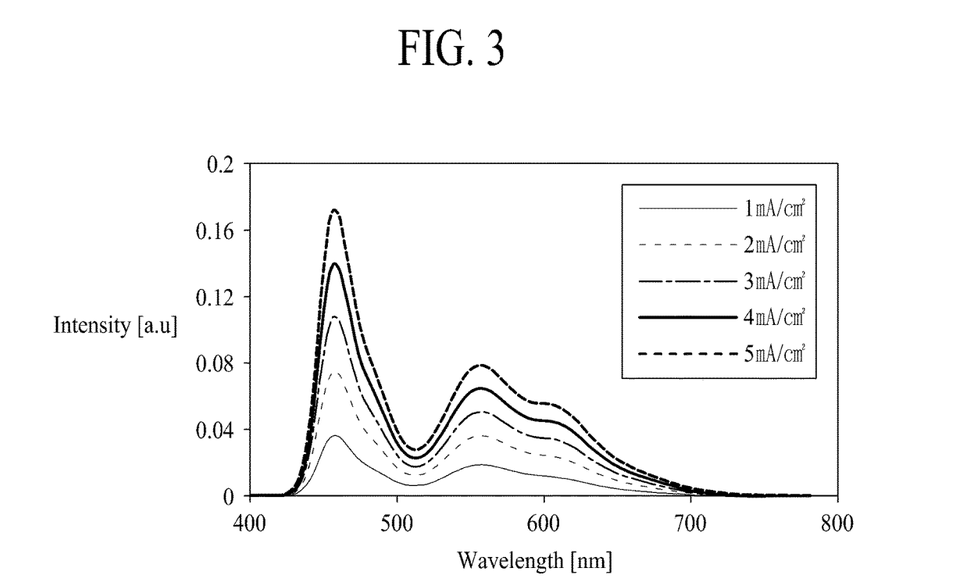
FIG. 3 is a diagram showing an EL spectrum with respect to a current density, according to an embodiment 2 of the disclosure.
Figure 4:
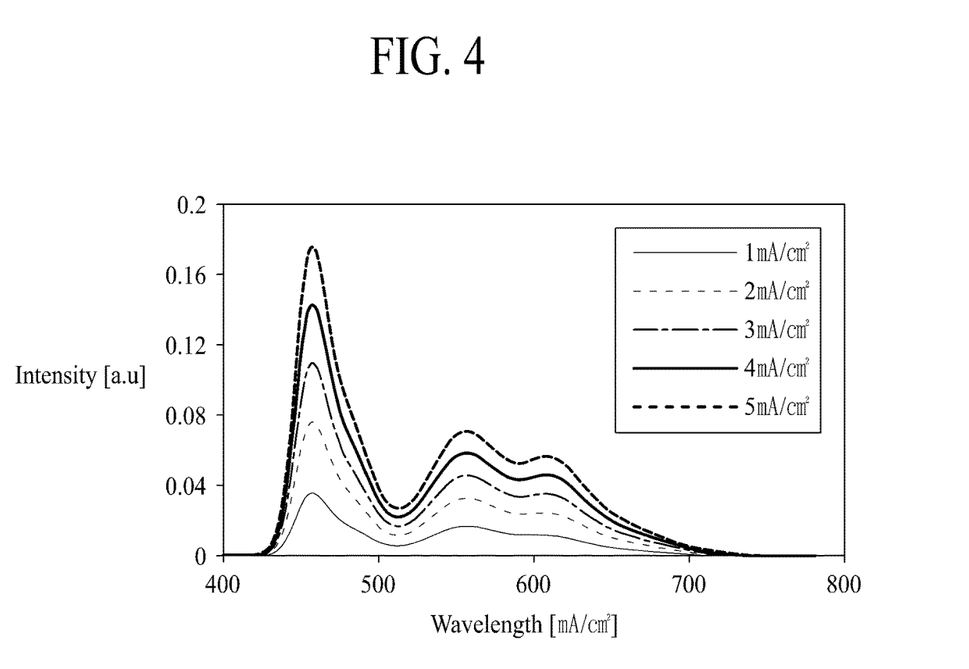
FIG. 4 is a diagram showing an EL spectrum with respect to a current density, according to an embodiment 3 of the disclosure.

FIGS. 2 to 4 show results obtained by measuring EL spectrums with respect to a current density in a case where the organic light emitting device of FIG. 1 is applied, and a dopant content included in a red EML is variously applied. The measurement has been performed under a condition where the dopant content included in the red EML is set to 1.0%, 2.0%, and 3.0%. Here, when a total amount of the red EML is 100 wet %, the dopant content is set to 1.0%, 2.0%, and 3.0% in weight ratio. Therefore, the dopant content included in the red EML being 1.0%, 2.0%, and 3.0% denotes that the dopant is doped on the red EML based on a weight ratio with respect to the total amount of the red EML. The yellow-green EML described below with reference to FIGS. 2 to 4 denotes that the yellow-green EML includes one among a yellow-green EML and a green EML. Thus, in the following description, yellow-green includes yellow-green or green. Also, an embodiment where the yellow-green EML is disposed on the red EML will be described as an example, but the disclosure is not limited thereto. In other embodiments, the same result is obtained even when the yellow-green EML is disposed under the red EML.

FIG. 2 is a diagram showing an EL spectrum with respect to a current density, according to an embodiment 1 of the disclosure.

In FIG. 2, the abscissa axis indicates a current density ($mA/cm^2$), and the ordinate axis indicates emission intensity (arbitrary unit (a.u.)). Also, in the embodiment 1 of FIG. 2, a dopant content included in a red EML is set to 1.0%.

The EL spectrum has been measured in a condition where the current density is applied from 1 $mA/cm^2$ to 5 $mA/cm^2$. The inventors have tested a peak wavelength corresponding to yellow-green and a peak wavelength corresponding to red with respect to the current density and consequently have checked emission of yellow-green light and red light. Also, the reason that the EL spectrum is measured up to a range of the current density including 5 $mA/cm^2$ is for further confirming emission of the yellow-green light and the red light in the EL spectrum.

As shown in FIG. 2, it can be seen that as the current density increases, emission intensity increases at 440 nm to 480 nm which a peak wavelength corresponds to blue. Also, it can be seen that as the current density increases, emission intensity increases at 510 nm to 590 nm which is a peak wavelength corresponding to yellow-green. Also, it can be seen that as the current density increases, emission intensity increases at 600 nm to 650 nm which is a peak wavelength corresponding to red. Accordingly, it can be seen that when the dopant content included in the red EML is 1.0%, emission of red light is suppressed compared to emission of yellow-green light.

FIG. 3 is a diagram showing an EL spectrum with respect to a current density, according to an embodiment 2 of the disclosure.

In FIG. 3, the abscissa axis indicates a current density ($mA/cm^2$), and the ordinate axis indicates emission intensity (a.u.). Also, in the embodiment 2 of FIG. 3, a dopant content included in a red EML is set to 2.0%.

The EL spectrum has been measured in a condition where the current density is variously applied from 1 $mA/cm^2$ to 5 $mA/cm^2$. The inventors have tested a peak wavelength corresponding to yellow-green and a peak wavelength corresponding to red with respect to the current density and consequently have checked emission of yellow-green light and red light. Also, the reason that the EL spectrum is measured up to a range of the current density including 5 $mA/cm^2$ is for further confirming emission of the yellow-green light and the red light in the EL spectrum.

As shown in FIG. 3, it can be seen that as the current density increases, emission intensity increases at 440 nm to 480 nm which a peak wavelength corresponds to blue. Also, it can be seen that as the current density increases, emission intensity increases at 510 nm to 590 nm which is a peak wavelength corresponding to yellow-green. Also, it can be seen that as the current density increases, emission intensity increases at 600 nm to 650 nm which is a peak wavelength corresponding to red. Also, in comparison with the embodiment 1, emission of red light is performed a little in the embodiment 2, but it can be seen that when the dopant content included in the red EML is 2.0%, emission of red light is almost suppressed compared to emission of yellow-green light.

FIG. 4 is a diagram showing an EL spectrum with respect to a current density, according to an embodiment 3 of the disclosure.

In FIG. 4, the abscissa axis indicates a current density ($mA/cm^2$), and the ordinate axis indicates emission intensity (a.u.). Also, in the embodiment 3 of FIG. 4, a dopant content included in a red EML is set to 3.0%.

The EL spectrum has been measured in a condition where the current density is variously applied from 1 $mA/cm^2$ to 5 $mA/cm^2$. The inventors have checked a peak wavelength corresponding to yellow-green and a peak wavelength corresponding to red with respect to the current density and consequently have checked emission of yellow-green light and red light. Also, the reason that the EL spectrum is measured up to a range of the current density including 5 $mA/cm^2$ is for further confirming emission of the yellow-green light and the red light in the EL spectrum.

As shown in FIG. 4, it can be seen that as the current density increases, emission intensity increases at 440 nm to 480 nm which a peak wavelength corresponds to blue. Also, it can be seen that as the current density increases, emission intensity increases at 510 nm to 590 nm which is a peak wavelength corresponding to yellow-green. Also, it can be seen that as the current density increases, emission intensity increases at 600 nm to 650 nm which is a peak wavelength corresponding to red. Also, in comparison with the embodiments 1 and 2, emission of red light is relatively more performed and emission of yellow-green light is performed relatively less than emission of the red light in the embodiment 3, and thus, it can be seen that when the dopant content included in the red EML is 3.0%, emission of the red light is performed more than emission of the yellow-green light. Also, in a current density of 1 $mA/cm^2$ corresponding to a gray scale, it can be seen that in comparison with the embodiments 1 and 2, the peak wavelength corresponding to red is almost similar to the peak wavelength corresponding to yellow-green in the embodiment 3. Accordingly, it can be seen that when the dopant content included in the red EML is set to less than 3.0%, emission of the red light is suppressed.

As described above with reference to FIGS. 2 to 4, it can be seen that emission of the red light is performed based on the dopant content included in the red EML. In FIGS. 2 to 4, the dopant content included in the red EML is set to 1.0%, 2.0%, and 3.0%. In a case of equipment which is used at present, EL spectrum is measured in units of 1.0%, and thus, in a case of using equipment that enables the EL spectrum to be measured in units of 0.5% in dopant content, the EL spectrum may be measured even when a dopant content is applied 0.5%, 1.0%, and 1.5%. Therefore, through the results shown in FIGS. 2 to 4, it can be seen that when the dopant content included in the red EML is 3.0% or more, emission of the red light is performed. It can be considered that emission of the red light being performed denotes that the yellow-green light is not emitted. Also, through various experiments, the inventors have recognized that since the red light is more emitted in a low gray scale than a high gray scale according to the dopant content, color coordinates are changed, and for this reason, it is difficult to realize desired color coordinates. Also, through various experiments, the inventors have recognized that since the dopant included in the red EML acts as a hole trap site, a hole is not supplied to the red EML and the yellow-green EML, and for this reason, a driving voltage of an organic light emitting device increases. Therefore, in order to suppress emission of the red light and prevent the driving voltage from increasing, the dopant content included in the red EML may be set lower than the dopant content included in the yellow-green EML or the green EML. This causes a problem where in a case where one emission part includes the red EML and the yellow-green EML or the green EML, when the dopant content included in the red EML becomes higher than the dopant content included in the yellow-green EML, the red light is more emitted than the yellow-green light, and for this reason, the yellow-green light cannot be emitted. Therefore, the dopant content included in the yellow-green EML or the green EML may be adjusted to 10.0% to 40.0%, based on emission efficiency of the yellow-green EML or the green EML. Also, the dopant content included in the red EML may be adjusted to 0.1% to 10.0% which is lower than the dopant content included in the yellow-green EML or the green EML. Exemplarily, the dopant content included in the red EML may be adjusted to 0.1% or more and less than 3.0%. Here, a dopant content denotes a weight ratio with respect to 100% EML. Also, the low gray scale denotes that the current density is 1 mA/cm$^2$ or less, the high gray scale denotes that the current density is more than 1 mA/cm$^2$ and 40 mA/cm$^2$ or more.

A result, obtained by measuring a color difference, a digital cinema initiatives (DCI) coverage, a voltage, and efficiency based on the dopant content included in the red EML described above with reference to FIGS. 2 to 4, will be described with reference to FIG. 5 and Table 1.

Figure 5:
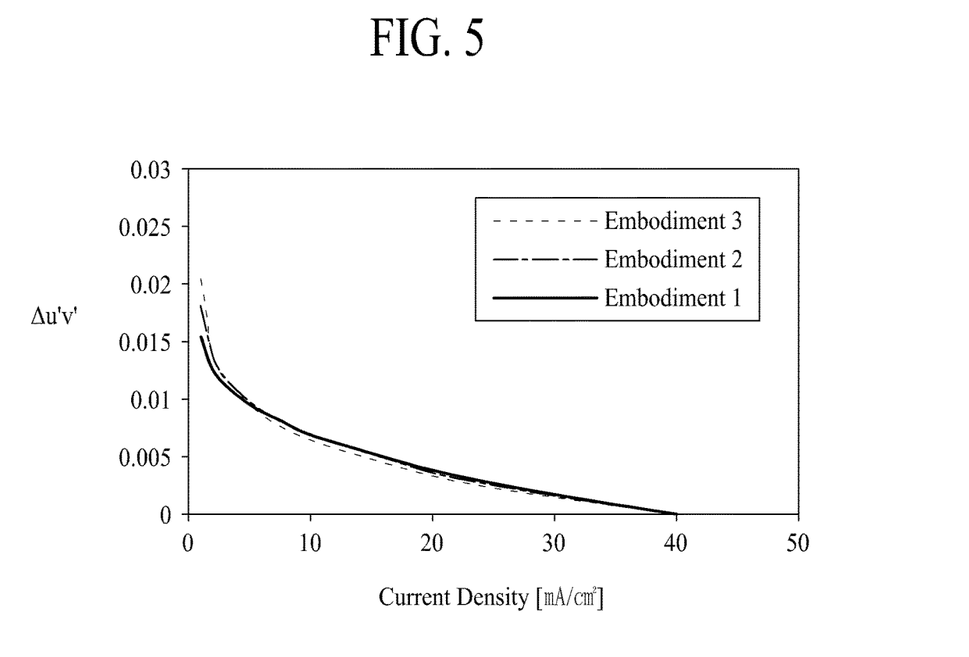
FIG. 5 is a diagram showing a current density-based color difference of the embodiments 1 to 3 of the disclosure.

FIG. 5 is a diagram showing a current density-based color difference of the embodiments 1 to 3 of the disclosure.

In FIG. 5, the abscissa axis indicates a current density (mA/cm$^2$), and the ordinate axis indicates a color difference (Δu'v'). The color difference (Δu'v') denotes a color difference with respect to a current density and denotes a difference between color coordinates at 1 mA/cm$^2$ and color coordinates at 40 mA/cm$^2$.

In FIG. 5, the organic light emitting device of FIG. 1 is applied to the embodiments 1 to 3 of the disclosure. In the dopant content included in the red EML, the embodiment 1 is 1.0%, the embodiment 2 is 2.0%, and the embodiment 3 is 3.0%.

As shown in FIG. 5, it can be seen that in the color difference (Δu'v'), the embodiment 1 is 0.015, the embodiment 2 is 0.018, and the embodiment 3 is 0.021. When the color difference (Δu'v') exceeds 0.020, emission of the red light is more strongly performed than emission of the green light, and for this reason, a user feels a color difference in an organic light emitting display device. That is, it can be seen that the color difference (Δu'v') should be 0.020 or less in a case color coordinates in the current density of 1 mA/cm$^2$ is compared with color coordinates in the current density of 40 mA/cm$^2$ in the organic light emitting display device, for suppressing emission of the red light. Therefore, it can be seen that the dopant content included in the red EML should be lower than the dopant content included in the yellow-green EML or the green EML, in order for the color difference (Δu'v') to become 0.020 or less. That is, the dopant content included in the red EML may be 0.1% to 10.0%. Exemplarily, the dopant content included in the yellow-green EML or the green EML may be 0.1% or more and less than 3.0%.

The following Table 1 shows a DCI coverage, a voltage (V), and efficiency (cd/A) in a comparative example and the embodiments 1 to 3 of the disclosure. Here, the DIC coverage has been obtained through simulation.

TABLE 1

| Division | Comparative Example | Embodiment 1 | Embodiment 2 | Embodiment 3 |
|---|---|---|---|---|
| DCI coverage (%) | 96.6 | 98.6 | 98.8 | 98.6 |
| Voltage (V) | 12.0 | 12.2 | 12.4 | 12.5 |
| Efficiency (cd/A) | 84.8 | 85.5 | 79.8 | 75.2 |

As shown in Table 1, in the comparative example 1, the second emission part 120 included in the organic light emitting device of FIG. 1 is configured with a yellow-green EML instead of a red EML.

In comparison with the comparative example, it can be seen that in the embodiments 1 to 3 of the disclosure, the DCI coverage is enhanced. That is, in comparison with the comparative example, it can be seen that in the embodiments 1 to 3 of the disclosure, a red EML is further provided, and by adjusting a dopant content included in the red EML, the DCI coverage is enhanced. Therefore, since the DCI coverage is enhanced, a color reproduction rate is enhanced, and thus, a large-screen television (TV) displays various colors, thereby providing good image quality.

Also, the voltage (V) and the efficiency (cd/A) have been measured in the current density of 10 mA/cm$^2$.

In comparison with the comparative example, it can be seen that in the embodiments 1 to 3 of the disclosure, the voltage increases a little. In comparison with the embodiments 1 and 2, it can be seen that in the embodiment 3, the voltage increases.

In comparison with the comparative example, it can be seen that in the embodiment 1, the efficiency is enhanced. In comparison with the embodiments 1 and 2, it can be seen that in the embodiment 3, the efficiency is reduced. It can be seen that the embodiment 3 is almost similar to the embodiments 1 and 2 in the DCI coverage, the embodiment 3 further increases than the embodiments 1 and 2 in the voltage, and the embodiment 3 is further reduced than the embodiments 1 and 2 in the efficiency.

Therefore, a dopant content included in a red EML may be adjusted, thereby providing an organic light emitting display device in which a voltage hardly increases, efficiency is hardly reduced, and a color reproduction rate is enhanced.

As described above, it can be seen that a dopant content included in a red EML may be adjusted to minimize a problem where red light is more emitted than yellow-green or green light when the red EML is further provided in one emission part for enhancing red efficiency. That is, the dopant content included in the red EML may be adjusted lower than the dopant content included in a yellow-green EML or a green EML. The dopant content included in the red EML may be 0.1% to 10.0%. Exemplarily, the dopant content included in the red EML may be 0.1% or more and less than 3.0%. Therefore, by adjusting the dopant content included in the red EML, the red light and the yellow-green or green light may be emitted in a current density of 1 mA/cm$^2$ or less corresponding to a low gray scale, thereby reducing a color difference based on a gray scale. Also, by adjusting the dopant content included in the red EML, efficiency is hardly reduced, a voltage hardly increases, and a DCI coverage is enhanced, thereby enhancing a color reproduction rate. Accordingly, an organic light emitting display device in which a color difference is 0.020 or less is provided. Alternatively, when two EMLs having different wavelength ranges are provided in one emission part, the two EMLs may be differently configured in content of a dopant. Alternatively, when two EMLs having different wavelength ranges are provided in one emission part, a dopant content included in an EML corresponding to a long wavelength among the two EMLs having different wavelength ranges may be adjusted lower than a dopant content included in an EML corresponding to a wavelength shorter than the long wavelength. Alternatively, provided is an organic light emitting display device in which the dopant content included in the red EML is adjusted to minimize a problem where when two or more emission parts each including the red EML and the yellow-green EML or the green EML are provided in the organic light emitting display device, the red light is more emitted than the yellow-green light or the green light in the current density of 1 mA/cm$^2$ or less, and for this reason, the yellow-green light or the green light is not emitted. Alternatively, provided is an organic light emitting display device in which the dopant content included in the red EML is adjusted in order for the red light and the green light to be all emitted in the current density of 1 mA/cm$^2$ or less when two or more emission parts each including the red EML and the yellow-green EML or the green EML are provided in the organic light emitting display device.

The above-described organic light emitting device may be applied to a lighting apparatus, may be used as a light source of a liquid crystal display (LCD) device, and may be applied to a display device. An organic light emitting display device including the organic light emitting device according to an embodiment of the disclosure may be a white organic light emitting display device that emits white light by using a first emission part including a first EML, a second emission part including a second EML, and a third emission part including a third EML. Therefore, when the organic light emitting device according to an embodiment of the disclosure is applied to an organic light emitting display device, the organic light emitting display device may be implemented as a white organic light emitting display device including four pixels (for example, a white pixel, a red pixel, a green pixel, and a blue pixel). Alternatively, when the organic light emitting device according to an embodiment of the disclosure is applied to an organic light emitting display device, the organic light emitting display device may be implemented as a white organic light emitting display device including three pixels (for example, a red pixel, a green pixel, and a blue pixel). Also, an organic light emitting display device including the organic light emitting device according to an embodiment of the disclosure may be applied to a bottom emission display device, a top emission display device, a dual emission display device, a lighting device for vehicles, and/or the like. The lighting device for vehicles may be at least one among headlights, a high beam, taillights, a brake light, a back-up light, a fog lamp, a turn signal light, and an auxiliary lamp, but is not limited thereto. Alternatively, the organic light emitting display device including the organic light emitting device according to an embodiment of the disclosure may be applied to all indicator lamps which are used to secure a field of view of a driver and transmit or receive a signal of a vehicle. Also, the organic light emitting display device including the organic light emitting device according to an embodiment of the disclosure may be applied to mobile equipment, monitors, televisions (TVs), and/or the like. In the organic light emitting display device including the organic light emitting device according to an embodiment of the disclosure, a pixel area may be defined on the substrate 101 by a gate line and a data line. A power line which extends in parallel with one among the gate line and the data line may be disposed on the substrate 101, and a switching TFT connected to the gate line or the data line and a driving TFT connected to the switching TFT may be disposed in the pixel area. The driving TFT may be connected to the first electrode 102.

Hereinafter, an embodiment where the organic light emitting device according to an embodiment of the disclosure is applied to a display device will be described.

Figure 6:
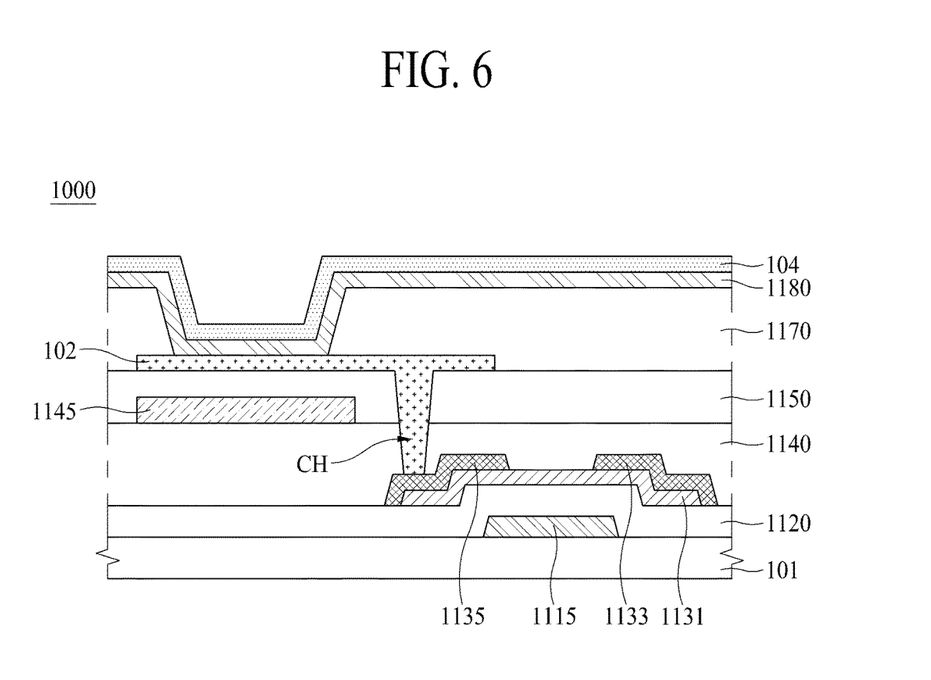
FIG. 6 is a diagram illustrating an organic light emitting display device according to an embodiment of the disclosure.

FIG. 6 is a cross-sectional view of an organic light emitting display device 1000 according to an embodiment of the disclosure, and the above-described organic light emitting device of FIG. 1 is applied to the organic light emitting display device 1000. An example of the organic light emitting display device 1000 illustrated in FIG. 6 does not limit details of the disclosure, and may be applied to a top emission display device, a dual emission display device, etc.

As illustrated in FIG. 6, the organic light emitting device 1000 according to an embodiment of the disclosure includes a substrate 101, a thin film transistor TFT, a first electrode 102, an emission part 1180, and a second electrode 104.

The substrate 101 may be formed of an insulating material or a material having flexibility. The substrate 101 may be formed of glass, metal, plastic, and/or the like, but is not limited thereto. If an organic light emitting display device is a flexible organic light emitting display device, the substrate 101 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The thin film transistor TFT may be formed on the substrate 101. The thin film transistor TFT may include a gate electrode 1115, a gate insulation layer 1120, a semiconductor layer 1131, a source electrode 1133, and a drain electrode 1135.

The gate electrode 1115 may be formed on the substrate 101 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof.

The gate insulation layer 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulation layer 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

In FIG. 6, the thin film transistor TFT is illustrated as having an inverted staggered structure, but may be formed in a coplanar structure.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

An overcoating layer 1150 may be formed on the color filter 1145 and may be formed of an acryl resin, a polyimide resin, SiOx, SiNx, or a multilayer thereof, but is not limited thereto.

The first electrode 102 may be formed on the overcoating layer 1150 and may be formed of transparent conductive oxide (TCO) which is a transparent conductive material such as indium tin oxide (ITO) or indium zinc oxide (IZO) but is not limited thereto. Alternatively, the first electrode 102 may be formed of gold (Au), silver (Ag), aluminum (Al), molybdenum (Mo), magnesium (Mg), lithium (Li), calcium (Ca), Ag—Mg, Mg—LiF, ITO, IZO, and/or the like, or may be formed of an alloy thereof. The first electrode 102 may be formed of a single layer or a multilayer. However, the present embodiment is not limited thereto.

The first electrode 102 may be electrically connected to the drain electrode 1135 through a contact hole CH which is formed in a certain area of the passivation layer 1140 and the overcoating layer 1150. In FIG. 6, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

A bank layer 1170 may be formed on the first electrode 102 and may be formed of an organic material such as a benzocyclobutene (BCB) resin, an acryl resin, a polyimide resin, and/or the like. The bank layer 1170 may be formed on the first electrode 102 to have a certain opening and to be spaced apart from the first electrode 102, in order for light emitted from the emission part 1180 to pass through the bank layer 1170.

The bank layer 1170 may be formed of a photosensitive material containing a black pigment. In this case, the bank layer 1170 may act as a light blocking member.

The emission part 1180 may be formed on the bank layer 1170. As illustrated in FIG. 1, the emission part 1180 may include the first emission part 110, the second emission part 120, and the third emission part 130 which are formed on the first electrode 102. Also, the second emission part 120 may include two EMLs having different wavelength ranges. That is, the EMLs of the second emission part 120 may include a red EML and a yellow-green EML or a green EML.

The second electrode 104 may be formed on the emission part 1180 and may be formed of Au, Ag, Al, Mo, Mg, Li, Ca, LiF, ITO, IZO, Ag—Mg, Mg—LiF, and/or the like, or may be formed of an alloy thereof. The second electrode 104 may be formed a single layer or a multilayer. However, the present embodiment is not limited thereto.

Moreover, an encapsulation layer (not shown) may be further formed on the second electrode 104. The encapsulation layer prevents moisture from penetrating into the emission part 1180. The encapsulation layer may include a plurality of layers where different inorganic materials are stacked, or include a plurality of layers where an inorganic material and an organic material are alternately stacked. Also, an encapsulation substrate (not shown) may be further formed on the encapsulation layer. The encapsulation substrate may be formed of glass, plastic, or metal. The encapsulation substrate may be adhered to the encapsulation layer by an adhesive.

The organic light emitting display device illustrated in FIG. 6 relates to a bottom emission display device where the light emitted from the emission part 1180 travels in a direction toward the first substrate 101, but the disclosure is not limited thereto. The disclosure may be applied to a top emission display device where the light emitted from the emission part 1180 travels in a direction toward the second substrate 104. In a top emission type, the color filter 1145 may be formed on the second electrode 104. Alternatively, the disclosure may be applied to a dual emission display device.

As described above, according to the embodiments of the disclosure, one emission part may include a red EML and a yellow-green EML or a green EML, and a dopant content included in the red EML is optimized, thereby reducing a color difference of the organic light emitting display device.

Moreover, according to the embodiments of the disclosure, one emission part may include a red EML and a yellow-green EML or a green EML, and a dopant content included in the red EML is optimized, thereby suppressing emission of red light based on a gray scale. Accordingly, a color difference of the organic light emitting display device is reduced.

The details of the disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the disclosure without departing from the spirit or scope of the disclosures. Thus, it is intended that the disclosure covers the modifications and variations of this disclosure provided they come within the scope of the appended claims and their equivalents.

What is claimed is:

1. An organic light emitting display device which includes first and second electrodes facing each other on a substrate and a plurality of emission parts between the first and second electrodes, at least one emission part among the plurality of emission parts comprising:
    a first emission layer and a second emission layer having different wavelength ranges,
    wherein each of the first and second emission layers includes at least one host and at least one dopant, and
    wherein a dopant content in the first emission layer is lower than a dopant content in the second emission layer.

2. The organic light emitting display device of claim 1, wherein
    the first emission layer comprises a red emission layer, and
    the second emission layer comprises one among a yellow-green emission layer and a green emission layer.

3. The organic light emitting display device of claim 1, wherein a peak wavelength of the first emission layer is 600 nm to 650 nm, and a peak wavelength of the second emission layer is 510 nm to 590 nm.

4. The organic light emitting display device of claim 1, wherein the dopant content in the first emission layer is 0.1% to 10.0%.

5. The organic light emitting display device of claim 4, wherein the dopant content in the first emission layer is 0.1% or more and less than 3.0%.

6. The organic light emitting display device of claim 1, wherein the first emission layer is disposed closer to the first electrode than the second emission layer.

7. The organic light emitting display device of claim 1, wherein the first emission layer is disposed closer to the second electrode than the second emission layer.

8. The organic light emitting display device of claim 1, wherein a color difference is 0.020 at 1 mA/cm$^2$ in comparison with 40 mA/cm$^2$ which is a current density of the organic light emitting display device.

9. An organic light emitting display device, comprising:
an anode and a cathode facing each other; and
an emission part between the anode and the cathode, the emission part including a plurality of emission layers having different wavelength ranges,
wherein
the plurality of emission layers having the different wavelength ranges, and each emission layer comprises at least one host and at least one dopant,
a dopant content in an emission layer corresponding to a long wavelength among the plurality of emission layers having the different wavelength ranges is lower than a dopant content in another emission layer corresponding to a wavelength shorter than the long wavelength.

10. The organic light emitting display device of claim 9, wherein
the emission layer corresponding to the long wavelength comprises a red emission layer, and
the other emission layer corresponding to the wavelength shorter than the long wavelength comprises one among a yellow-green emission layer and a green emission layer.

11. The organic light emitting display device of claim 9, wherein a peak wavelength of the emission layer corresponding to the long wavelength is 600 nm to 650 nm, and a peak wavelength of the other emission layer corresponding to the wavelength shorter than the long wavelength is 510 nm to 590 nm.

12. The organic light emitting display device of claim 9, wherein the dopant content in the emission layer corresponding to the long wavelength is 0.1% to 10.0%.

13. The organic light emitting display device of claim 12, wherein the dopant content in the emission layer corresponding to the long wavelength is 0.1% or more and less than 3.0%.

14. The organic light emitting display device of claim 9, wherein the emission layer corresponding to the long wavelength is disposed closer to the anode than the cathode.

15. The organic light emitting display device of claim 9, wherein the emission layer corresponding to the long wavelength is disposed closer to the cathode than the anode.

16. The organic light emitting display device of claim 9, wherein a color difference is 0.020 at 1 mA/cm$^2$ in comparison with 40 mA/cm$^2$ which is a current density of the organic light emitting display device.

17. An organic light emitting display device in which one emission part includes a red emission layer and a yellow-green emission layer or a green emission layer, characterized in that a dopant content in the red emission layer is adjusted to emit both red light and green light in a current density of 1 mA/cm$^2$ or less.

18. The organic light emitting display device of claim 17, wherein the dopant content in the red emission layer is 0.1% to 10.0%.

19. The organic light emitting display device of claim 18, wherein the dopant content in the red emission layer is 0.1% or more and less than 3.0%.

20. The organic light emitting display device of claim 17, wherein a color difference is 0.020 at 1 mA/cm$^2$ in comparison with 40 mA/cm$^2$ which is a current density of the organic light emitting display device.

21. The organic light emitting display device of claim 1, wherein the first emission layer and the second emission layer are separate layers, and wherein one of the first emission layer and the second emission layer is disposed closer to the second electrode than the other one of the first emission layer and the second emission layer.

* * * * *